US008139368B2

(12) United States Patent
Nomura

(10) Patent No.: US 8,139,368 B2
(45) Date of Patent: Mar. 20, 2012

(54) COMPONENT-CONTAINING MODULE

(75) Inventor: Masato Nomura, Moriyama (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 140 days.

(21) Appl. No.: 12/781,857

(22) Filed: May 18, 2010

(65) Prior Publication Data
US 2010/0220448 A1 Sep. 2, 2010

Related U.S. Application Data

(63) Continuation of application No. PCT/JP2008/066711, filed on Sep. 17, 2008.

(30) Foreign Application Priority Data

Nov. 20, 2007 (JP) ................... 2007-301064

(51) Int. Cl.
*H05K 1/18* (2006.01)

(52) U.S. Cl. ........ 361/763; 361/719; 361/752; 361/758; 174/260; 174/261; 174/262; 257/81; 257/433; 257/622; 257/666; 29/875; 438/106

(58) Field of Classification Search ................... 361/763, 361/719, 752, 758; 174/260–262; 257/81, 257/433, 622, 666; 29/875; 438/106
See application file for complete search history.

(56) References Cited

U.S. PATENT DOCUMENTS

| 7,845,954 B2 * | 12/2010 | Tomura et al. ................ 439/66 |
| 2003/0071350 A1 | 4/2003 | Takehara et al. |
| 2003/0197250 A1 * | 10/2003 | Nakazawa et al. ............ 257/666 |
| 2004/0069998 A1 * | 4/2004 | Harazono ........................ 257/81 |
| 2005/0151229 A1 * | 7/2005 | Imaizumi et al. ............. 257/622 |
| 2005/0201069 A1 * | 9/2005 | Kirigaya ......................... 361/752 |
| 2006/0267159 A1 | 11/2006 | Yamamoto et al. |

FOREIGN PATENT DOCUMENTS

| JP | 62-68324 A | 3/1987 |
| JP | 5-283901 A | 10/1993 |
| JP | 2003-18040 A | 1/2003 |

(Continued)

OTHER PUBLICATIONS

Official Communication issued in International Patent Application No. PCT/JP2008/066711, mailed on Jan. 13, 2009. Official Communication issued in corresponding Japanese Patent Application No. 2008-508538, mailed on Jan. 5, 2011.

*Primary Examiner* — Xiaoliang Chen
(74) *Attorney, Agent, or Firm* — Keating & Bennett, LLP

(57) ABSTRACT

A component-containing module includes a core substrate which includes a lower surface including recessed portions and a raised portion, and an upper surface facing the lower surface and which includes a plurality of in-plane conductors, an integrated circuit element arranged at a location which is above the upper surface and which corresponds to the raised portion, a first passive element and a second passive element disposed in the recessed portions of the lower surface, a composite resin layer which underlies the lower surface and which has a flat or substantially flat surface, and an external terminal electrode which is disposed on the flat or substantially flat surface of the composite resin layer and which is electrically connected to the in-plane conductors of the core substrate. The component-containing module enables electronic components, such as integrated circuit elements and passive elements, to be densely arranged and to be reduced in profile and size.

8 Claims, 8 Drawing Sheets

FOREIGN PATENT DOCUMENTS

| | | |
|---|---|---|
| JP | 2003-229521 A | 8/2003 |
| JP | 2004-128799 A | 4/2004 |
| JP | 2005-101366 A | 4/2005 |
| JP | 2005-244860 A | 9/2005 |
| JP | 2005-347479 A | 12/2005 |
| JP | 3890947 B2 | 3/2007 |
| WO | 2005/078796 A1 | 8/2005 |

* cited by examiner

COMPONENT-CONTAINING MODULE

BACKGROUND OF THE INVENTION

1. Field of the Invention

The present invention relates to a component-containing module including a core substrate and an electronic component which is mounted on the core substrate and which is sealed with resin.

2. Description of the Related Art

In recent years, advanced compact module components have been demanded. A component-containing module having a structure in which electronic components are mounted on both surfaces of a core substrate and the electronic components located on the mounting surface side thereof are embedded in resin has been used. In such a component-containing module, electronic components mounted on the mounting surface side of a core substrate are embedded in resin and, therefore, a flat mounting surface can be provided. A known example of the component-containing module is a high-frequency semiconductor device disclosed in Japanese Patent No. 3890947.

With reference to FIG. 8, the high-frequency semiconductor device, which is disclosed in Japanese Patent No. 3890947, includes a ceramic substrate 2, a circuit pattern which is disposed under the lower surface of the ceramic substrate 2 and which includes integrated circuit elements 1a, 1b, and 1c and passive elements (not shown), and a composite resin material layer 10 which covers the lower surface of the ceramic substrate and in which the integrated circuit elements 1a, 1b, and 1c and the passive elements are embedded. The composite resin material layer 10 has a flat lower surface. The lower surface of the composite resin material layer 10 has a plurality of external connection electrodes 4 disposed thereon. The composite resin material layer 10 includes via-holes 11. The via-holes 11 are filled with a conductive resin 12. The external connection electrodes 4, which are arranged on the composite resin material layer 10, are electrically connected to the circuit pattern, which covers the lower surface of the ceramic substrate 2, through the conductive resin 12. The upper surface of the ceramic substrate 2 includes a chip component 3, such as a chip capacitor, disposed thereon for finely tuning the high-frequency circuit constant. The ceramic substrate 2 includes passive elements, such as printing resistors 8 and printing capacitors 9 arranged therein. The integrated circuit elements 1a, 1b, and 1c are a gallium arsenide power semiconductor element 1a, a gallium arsenide semiconductor element 1b defining a switching element, and a silicon semiconductor element 1c for circuit control.

In the high-frequency semiconductor device (component-containing module), which is disclosed in Japanese Patent No. 3890947, the thickness of the ceramic substrate 2 substantially depends on the number of interconnection layers included in the circuit pattern because of the structure thereof. Therefore, an increase in the number of terminals of the integrated circuit elements 1a, 1b, and 1c, which are mounted on the ceramic substrate 2, increases the thickness of the ceramic substrate 2. Furthermore, the arrangement of the passive elements, the electron injection layer 8, and the cathode 9 in the ceramic substrate 2 increases the number of interconnection layers, which increases the thickness of the ceramic substrate 2. Therefore, there is a problem in that the size of the component-containing module is prevented from being reduced when the integrated circuit elements 1a, 1b, and 1c and the passive elements are densely arranged.

SUMMARY OF THE INVENTION

To prevent the problems described above, preferred embodiments of the present invention provide a component-containing module which includes electronic components, such as integrated circuit elements and passive elements, that are densely mounted on a substrate and which can be reduced in profile and size.

A component-containing module according to a preferred embodiment of the present invention includes a core substrate which includes a first principal surface and a second principal surface facing the first principal surface, said first principal surface including recessed portions and a raised portion, and the core substrate including a plurality of interconnection layers, an integrated circuit element arranged at a location which is above the second principal surface and which corresponds to the raised portion, passive elements disposed in the recessed portions of the first principal surface, a resin layer which overlies at least one of the first and second principal surfaces and which has a flat surface, and an electrode which is disposed on the flat surface of the resin layer and which is electrically connected to the interconnection layers.

In the component-containing module, the core substrate is preferably made of ceramic.

In the component-containing module, the resin layer preferably overlies the first principal surface and covers the raised portion.

The component-containing module preferably further includes a via-hole conductor connecting a convex surface of the raised portion to the electrode disposed on the flat surface of the resin layer.

The component-containing module preferably further includes a high heat conductor disposed in a portion of the resin layer that covers the convex surface of the raised portion.

In the component-containing module, the raised portion is preferably disposed at substantially the center of the first principal surface of the core substrate in a specific sectional view including the raised portion, the recessed portions are preferably arranged on both sides of the raised portion, and the passive elements are preferably separately disposed in the recessed portions.

In the component-containing module, the resin layer is preferably disposed on both the first and second principal surfaces.

The component-containing module preferably further includes a shielding layer disposed on the resin layer that is different from the resin layer on which the electrode is disposed and that is among the two resin layers formed on the first and second principal surfaces.

Thus, preferred embodiments of the present invention provide a component-containing module in which electronic components, such as integrated circuit elements and passive elements, are densely arranged and which can be reduced in profile and size.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
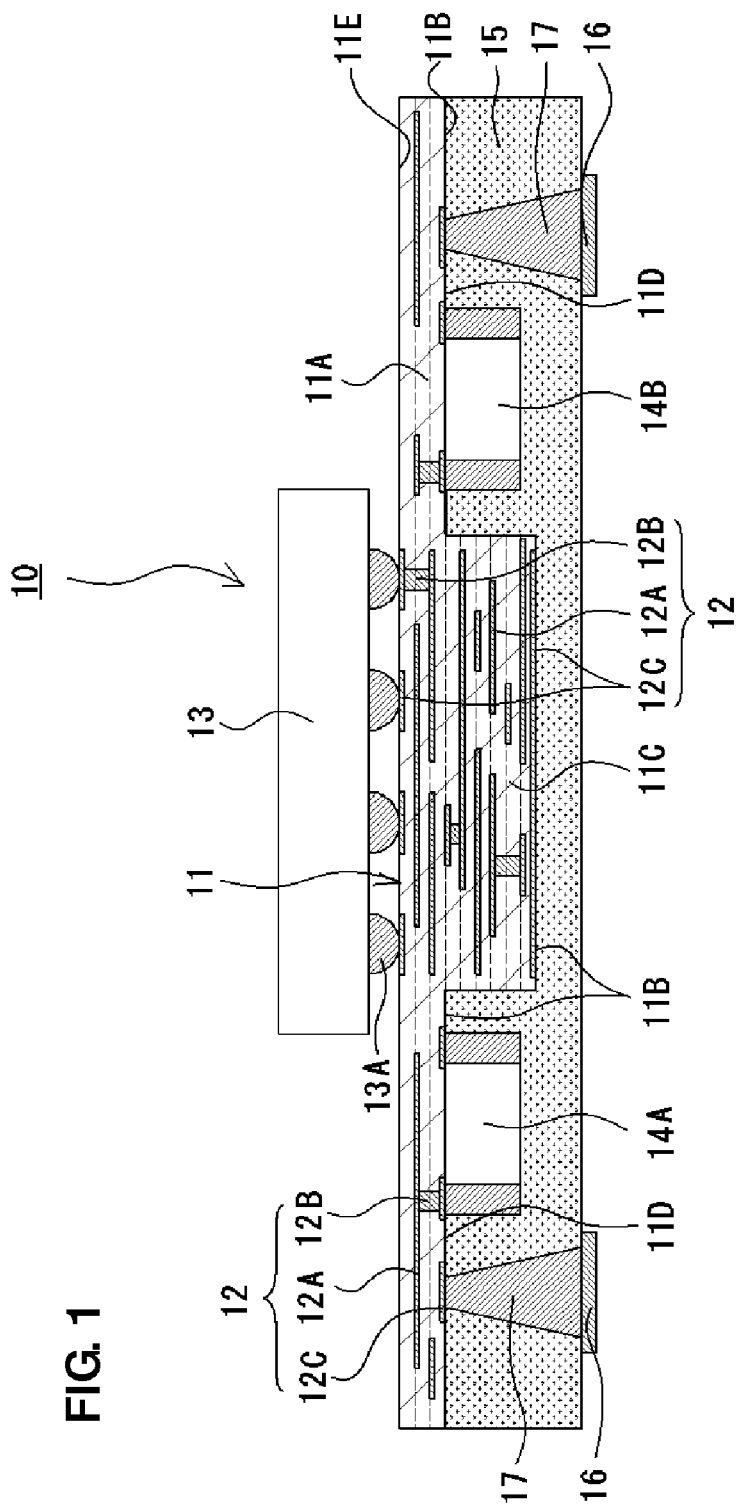
FIG. 1 is a sectional view of a component-containing module according to a first preferred embodiment of the present invention.
Figure 2:
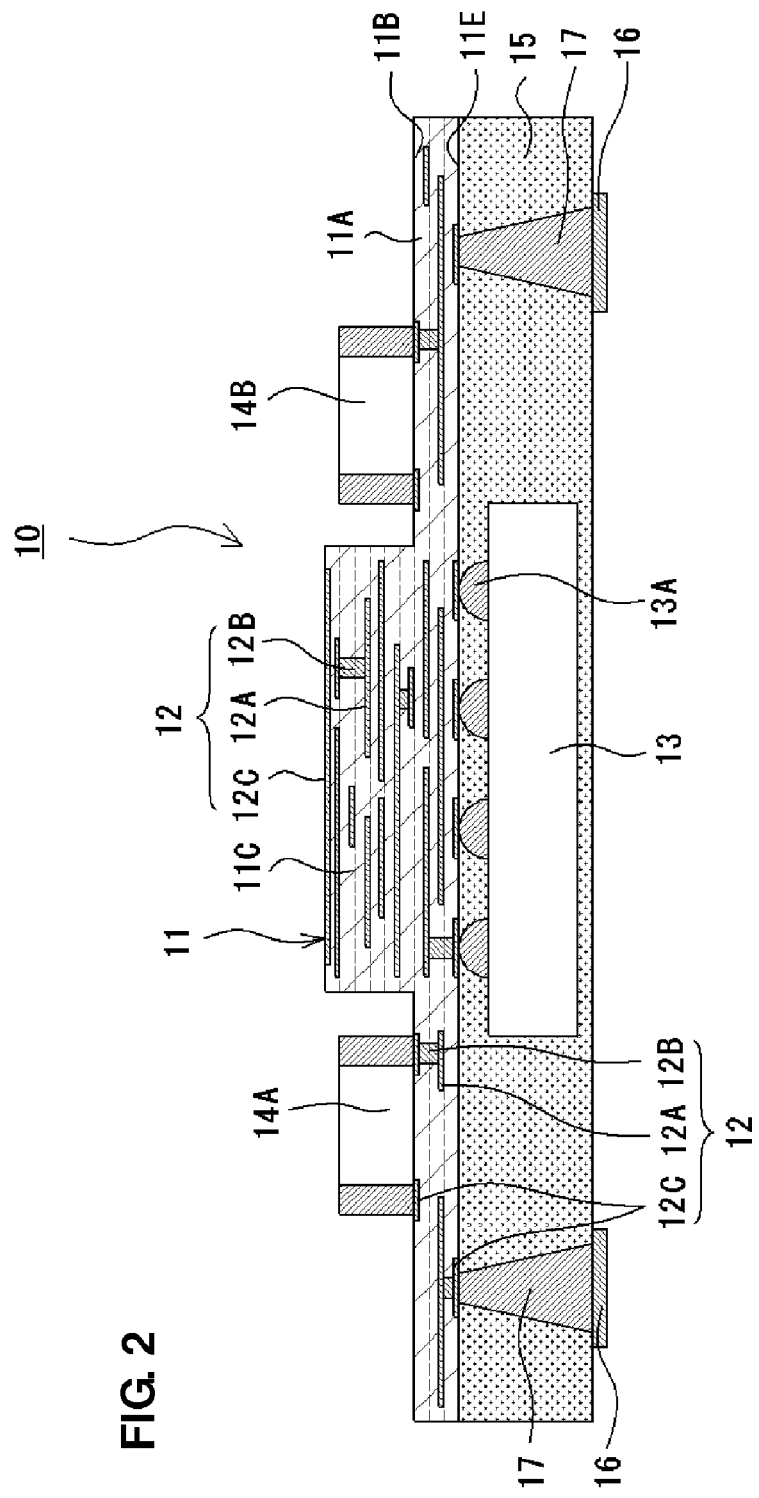
FIG. 2 is a sectional view of a modification of the component-containing module shown in FIG. 1.
Figure 3:
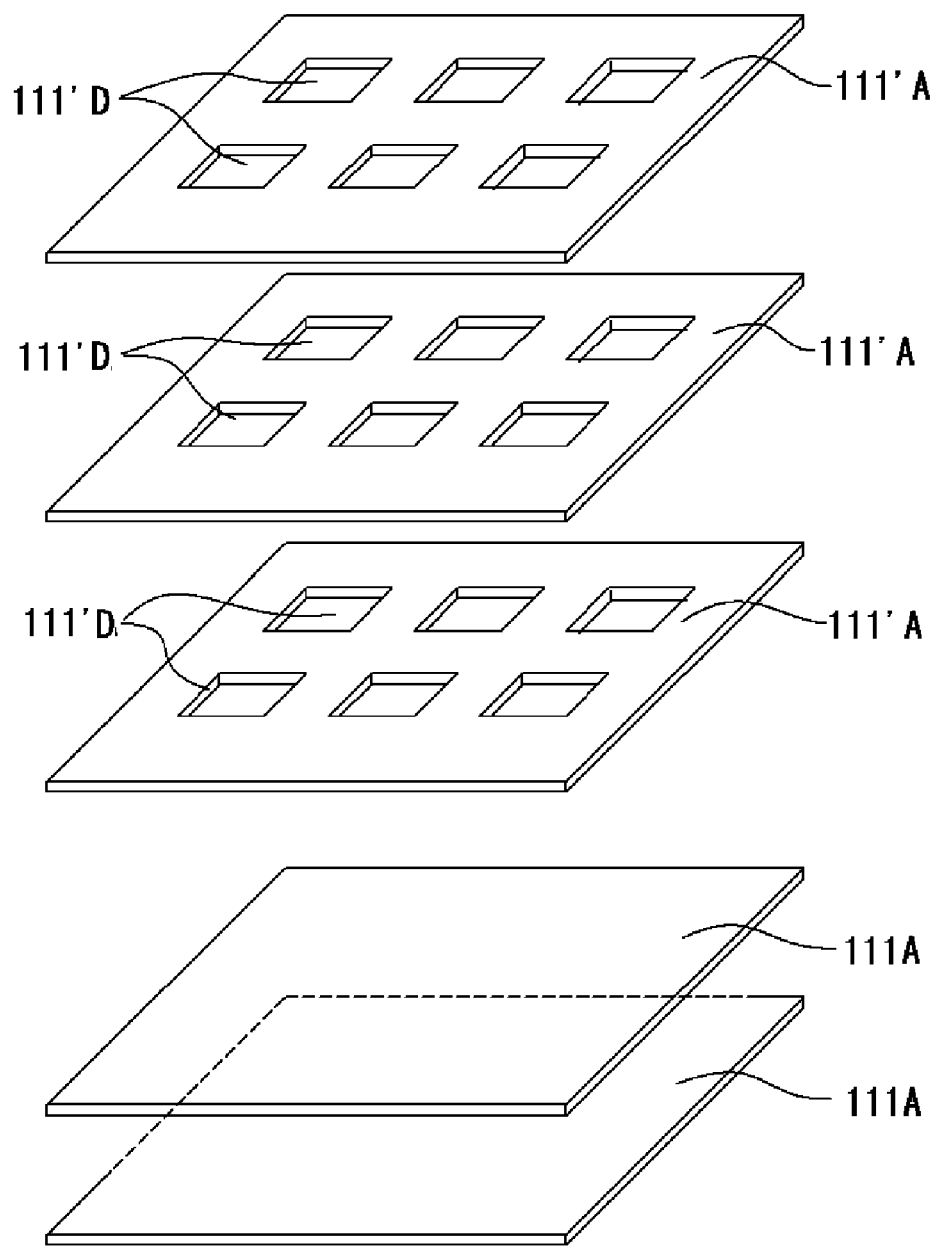
FIG. 3 is an illustration showing a step of a method for manufacturing a core substrate included in the component-containing module shown in FIG. 1.
Figure 4:
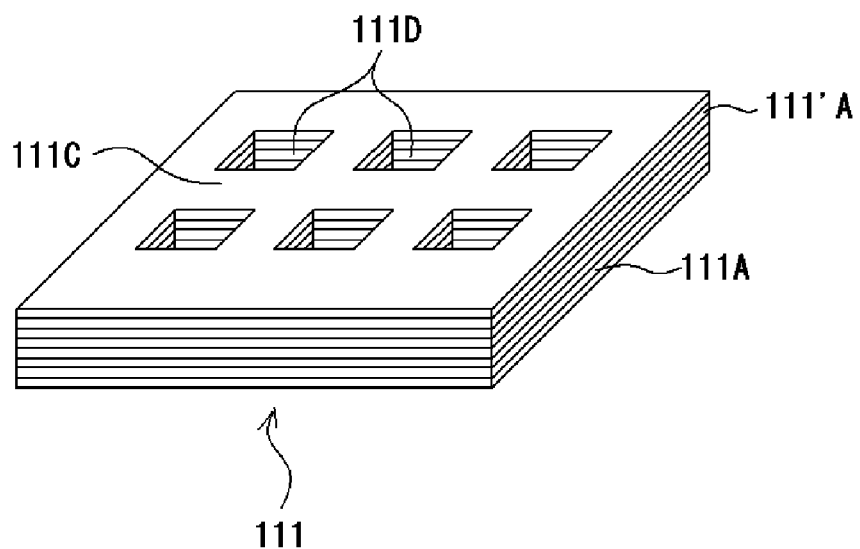
FIG. 4 is a perspective view of the core substrate formed through the step shown in FIG. 3.
Figure 5:
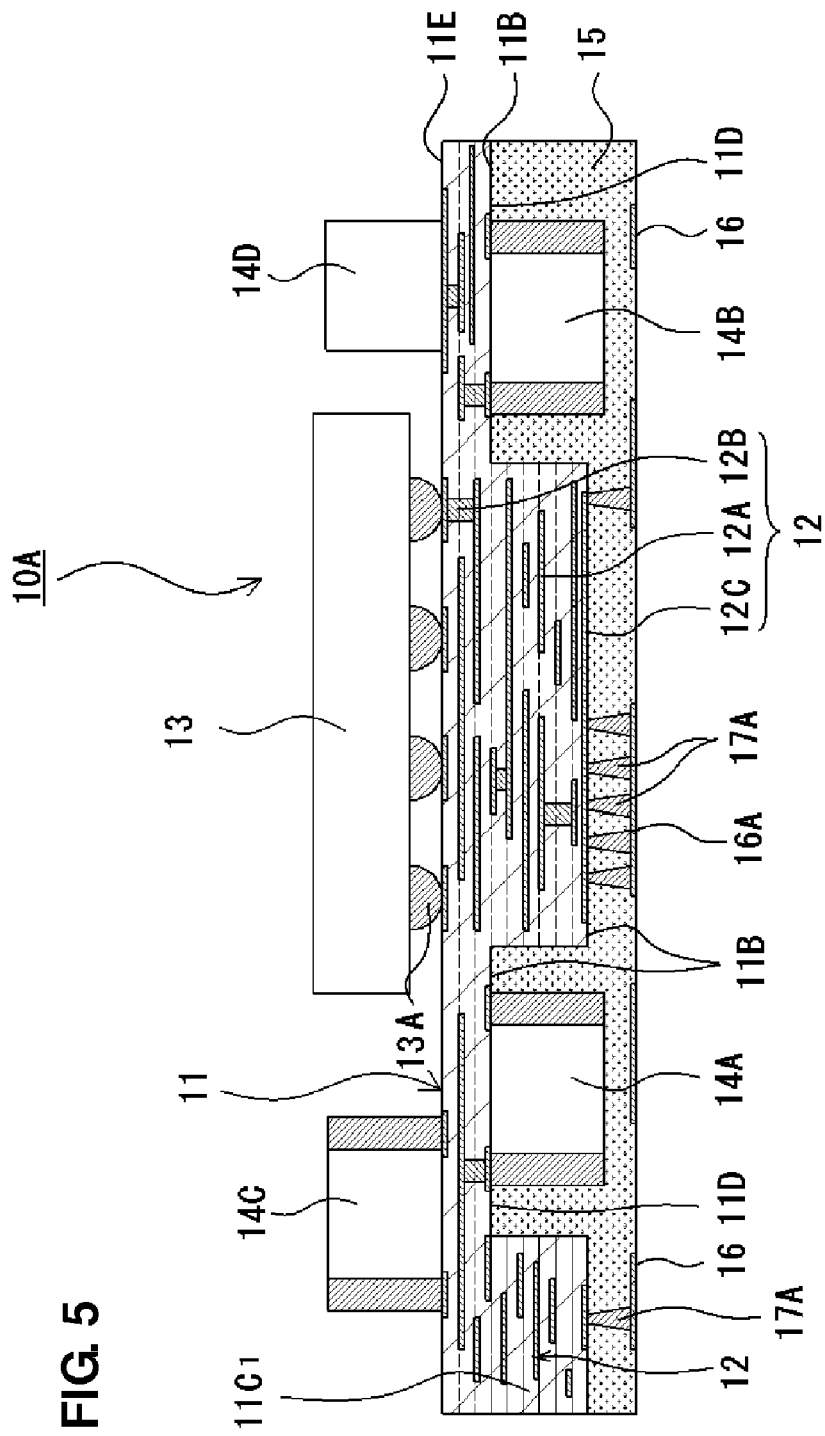
FIG. 5 is a sectional view of a component-containing module according to a second preferred embodiment of the present invention and corresponds to FIG. 1.
Figure 6:
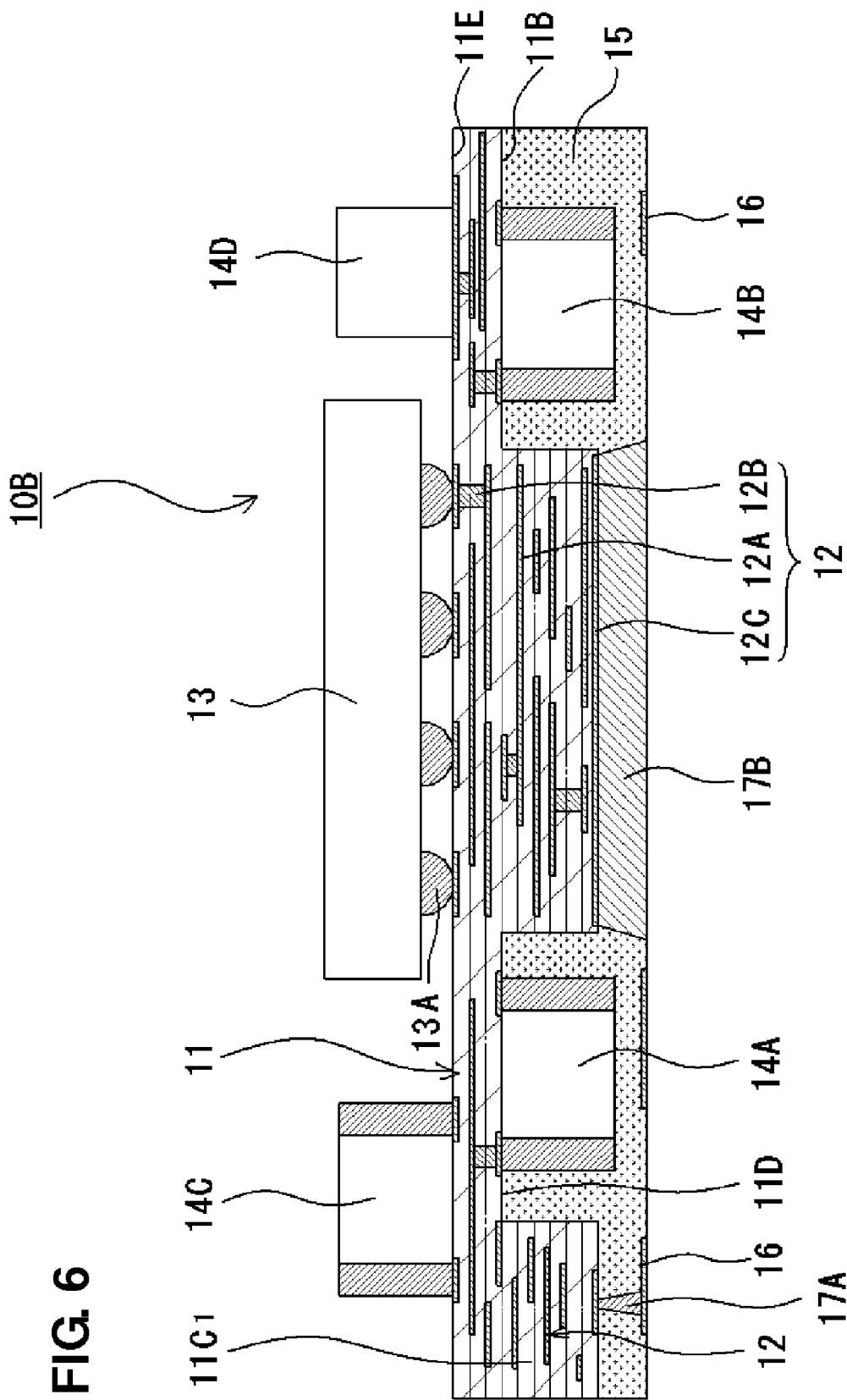
FIG. 6 is a sectional view of a component-containing module according to a third preferred embodiment of the present invention and corresponds to FIG. 1.
Figure 7:
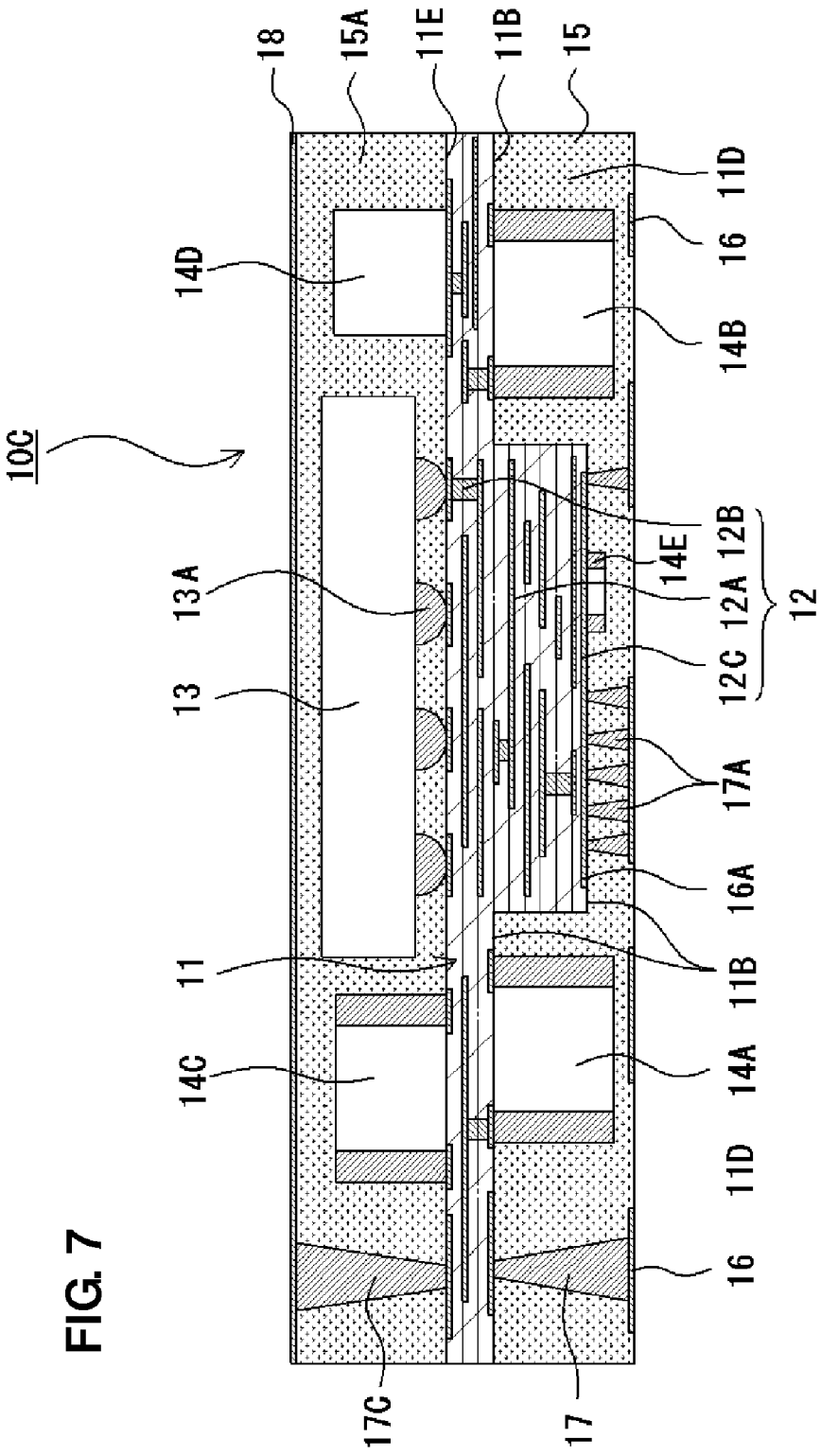
FIG. 7 is a sectional view of a component-containing module according to a fourth preferred embodiment of the present invention and corresponds to FIG. 1.
Figure 8:
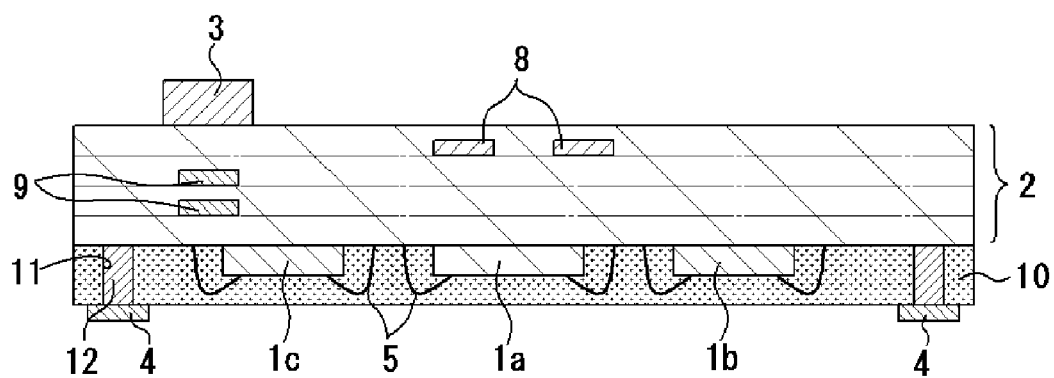
FIG. 8 is a sectional view of an example of a conventional component-containing module.

Preferred embodiments of the present invention will now be described with reference to FIGS. 1 to 7. FIG. 1 is a sectional view of a component-containing module according to a preferred embodiment of the present invention. FIG. 2 is a sectional view of a modification of the component-containing module shown in FIG. 1. FIG. 3 is an illustration showing a step of a method for manufacturing a core substrate included in the component-containing module shown in FIG. 1. FIG. 4 is a perspective view of the core substrate formed through the step shown in FIG. 3. FIGS. 5 to 7 are sectional views of component-containing modules according to other preferred embodiments of the present invention and correspond to FIG. 1.

First Preferred Embodiment

A component-containing module 10 of this preferred embodiment includes a core substrate 11 including a plurality of stacked ceramic layers 11A as shown in FIG. 1. The core substrate 11 includes a first principal surface (lower surface) 11B including a raised portion 11C and recessed portions 11D. The raised portion 11C is located at substantially the center of the lower surface 11B of the core substrate 11. The recessed portions 11D are arranged on the right and left of the raised portion 11C. The core substrate 11 includes a second principal surface (upper surface) 11E which faces the lower surface 11B and which is a flat or substantially flat surface having no irregularities. The recessed portions 11D and 11D, which are located on the right and left of the raised portion 11C, have the same or substantially the same depth. The ceramic layers 11A are arranged in the raised portion 11C and the recessed portions 11D and include predetermined circuit patterns 12. The circuit patterns 12 include interconnection layers (hereinafter referred to as "in-plane conductors") 12A which are each located at the interface between the upper and lower ceramic layers 11A and which have a predetermined pattern, via-hole conductors 12B which electrically connect the upper and lower in-plane conductors 12A and 12A to each other and which have a predetermined pattern, and surface electrodes 12C which are arranged on the lower surface 11B and upper surface 11E of the core substrate 11 and which have a predetermined pattern.

An integrated circuit element 13, such as a gallium arsenide semiconductor element or a silicon semiconductor element, is arranged at a location which is above the upper surface 11E of the core substrate 11 and which corresponds to the raised portion 11C as shown in FIG. 1. The integrated circuit element 13 is electrically connected to the surface electrodes 12C through a plurality of external terminal electrodes 13A by soldering. The raised portion 11C of the lower surface 11B of the core substrate 11 and the integrated circuit element 13, which is mounted above the upper surface 11E, overlap in plan view. Many of the circuit patterns 12 that are associated with the integrated circuit element 13 are centered in the raised portion 11C. To increase the number of the external terminal electrodes 13A under the integrated circuit element 13, the number of the in-plane conductors 12A arranged in the raised portion 11C is increased and the in-plane conductors 12A are electrically connected to the surface electrodes 12C through the via-hole conductors 12B. This can accommodate the increase in the number of the external terminal electrodes 13A under the integrated circuit element 13. All of the external terminal electrodes 13A under the integrated circuit element 13 are preferably in an area defined by projecting the raised portion 11C onto the upper surface 11E of the core substrate 11. Junctions between the core substrate 11 and the external terminal electrodes 13A are likely to cause cracks in the core substrate 11. However, cracks are not caused therein because all of the external terminal electrodes 13A are in the projected area of the raised portion 11C and a portion of the core substrate 11 that is bonded to the external terminal electrodes 13A is relatively thick.

A first passive element 14A and second passive element 14B, such as a chip capacitor or a chip inductor, are disposed in the right and left recessed portions 11D and 11D of the core substrate 11 as shown in FIG. 1. The first and second passive elements 14A and 14B include external terminal electrodes and are electrically connected to the surface electrodes 12C through the external terminal electrodes thereof. The first and second passive elements 14A and 14B which are disposed in the recessed portions 11D preferably have a height less than that of the raised portion 11C, that is, a height not greater than that of the raised portion 11C. When the first and second passive elements 14A and 14B have a height less than that of the raised portion 11C, the height of the first and second passive elements 14A and 14B is less than the height of the core substrate 11. This allows the component-containing module 10 to have low profile.

A resin layer 15 (a composite resin layer preferably made of, for example, an organic resin material including an inorganic powder component) underlies the lower surface 11B of the core substrate 11. The raised portion 11C is entirely covered with the composite resin layer 15 and the first and second passive elements 14A and 14B are disposed in the recessed portions 11D and are sealed with the composite resin layer 15. The composite resin layer 15 has a flat or substantially flat lower surface. The composite resin layer 15 has a thin portion disposed under the lower surface 11B of the raised portion 11C and thick portions which are disposed under the lower surfaces 11B of the recessed portions 11D and which seal the first and second passive elements 14A and 14B. Thus, the lower surface thereof is flat or substantially flat. The recessed portions 11D of the core substrate 11 have an enhanced mechanical strength due to the composite resin layer 15.

A peripheral portion of the lower surface of the composite resin layer 15 includes a plurality of external terminal electrodes 16 arranged in a predetermined pattern. The external terminal electrodes 16 are arranged opposite to the surface electrodes 12C, which are arranged in the recessed portions 11D in a predetermined pattern, and are electrically connected to the circuit patterns 12 through via-hole conductors disposed in the composite resin layer 15. The via-hole conductors 17 are formed such that tapered via-holes are formed in the composite resin layer 15 using, for example, a laser beam and are then filled with a conductive resin. The external terminal electrodes 16 are used to electrically connect the component-containing module 10 to surface electrodes of a mounting board, such as a mother board, for example.

The integrated circuit element 13 is located at a position which is above the upper surface 11E and which corresponds to the raised portion 11C corresponding to the raised portion 11C as described above. The raised portion 11C includes the ceramic layers 11A, which have good heat conductivity. Thus, even if the integrated circuit element 13 generates heat, the heat generated therefrom is readily transferred to the lower surface 11B through the raised portion 11C and, therefore, can be efficiently dissipated from the lower surface 11B of the raised portion 11C. The recessed portions 11D of the core substrate 11 are mechanically reinforced with the composite resin layer 15 and, therefore, have good resistance to impact due to falling.

In this preferred embodiment, as shown in FIG. 1, the lower surface 11B of the core substrate 11 is covered with the composite resin layer 15 such that the raised portion 11C and the first and second passive elements 14A and 14B are embedded in the composite resin layer 15 as described above. As shown in FIG. 2, the integrated circuit element 13 may preferably be embedded in the composite resin layer 15 by covering the upper surface 11E of the core substrate 11 with the composite resin layer 15 and the raised portion 11C of the lower surface 11B of the core substrate 11 and the first and second passive elements 14A and 14B may be exposed. In this configuration, a low-profile compact module similar to the component-containing module 10 shown in FIG. 1 can be obtained because the circuit patterns 12 associated with the integrated circuit element 13 can be centered in the raised portion 11C and the first and second passive elements 14A and 14B, which are located on the right and left of the raised portion 11C, are disposed in the recessed portions 11D. The mechanical strength of the recessed portions 11D can be improved with the composite resin layer 15. Substantially the same advantages as those of the component-containing module 10 shown in FIG. 1 can be achieved.

In this preferred embodiment, the core substrate 11 preferably includes the ceramic layers 11A as described above. The core substrate 11 is not limited to the ceramic layer. The core substrate 11 may preferably be formed by stacking resin layers made of, for example, a heat-curable resin.

When the core substrate 11 includes a ceramic layer, for example, a low temperature co-fired ceramic (LTCC) material can be used as a material for the ceramic layers 11A. The low temperature co-fired ceramic material is a type of ceramic material which is sinterable at a temperature of about 1050° C. or less and which can be co-fired with silver or copper, which has low resistivity. Examples of the low temperature co-fired ceramic material include a composite glass LTCC material prepared from a mixture of borosilicate glass and a ceramic powder, such as an alumina powder, a zirconia powder, a magnesia powder, or a forsterite powder; a crystalline glass LTCC material prepared from $ZnO$—$MgO$—$Al_2O_3$—$SiO_2$ crystalline glass; and a non-glass LTCC material prepared from a $BaO$—$Al_2O_3$—$SiO_2$ ceramic powder, an $Al_2O_3$—$CaO$—$SiO_2$—$MgO$—$B_2O_3$ ceramic powder, and/or another ceramic powder. When the ceramic layers 11A are made of the low temperature co-fired ceramic material, a metal, such as silver or copper, having low resistivity and a low melting point can be used to form the circuit patterns 12 and the core substrate 11 and the circuit patterns 12 can be formed at a temperature of about 1050° C. or less by co-firing.

Alternatively, a high temperature co-fired ceramic (HTCC) material can be used as a material for the ceramic layers 11A. The high temperature co-fired ceramic material is preferably one prepared by sintering a mixture of alumina, aluminum nitride, mullite, a sintering aid such as glass, and another material at about 1100° C. or greater. In this case, a metal material selected from the group consisting of molybdenum, platinum, palladium, tungsten, nickel, and alloys containing these metals, for example, can be used to form the circuit patterns 12.

A method for manufacturing the component-containing module 10 shown in FIG. 1 is schematically described below. The component-containing module 10 is manufactured such that a plurality of component-containing modules 10 are simultaneously prepared and are then separated from one another. As shown in FIG. 3, for example, a predetermined number of first ceramic green sheets 111A having a size corresponding to that of the component-containing modules 10 are prepared. Via-holes (not shown) are formed in the first ceramic green sheets 111A in a predetermined pattern and are then filled with, for example, a conductive paste. In-plane conductive portions (not shown) having a predetermined pattern are each formed on the upper surface of a corresponding one of the first ceramic green sheets 111A by screen printing.

In order to form the raised portion 11C and the recessed portions 11D on the lower surface 11B of each component-containing module 10, a predetermined number of second ceramic green sheets 111'A having stamped out portions 111'D arranged in a matrix pattern are prepared such that the first ceramic green sheets 111A are stamped with a rectangular die as shown in FIG. 3. In-plane conductive portions and via-hole conductors are formed on the upper surfaces of the second ceramic green sheets 111'A as well as on the first ceramic green sheets 111A.

After a predetermined number of the first ceramic green sheets 111A are stacked, a predetermined number of the second ceramic green sheets 111'A are stacked thereon, whereby a ceramic green sheet laminate 111 is obtained. The upper surface of the ceramic green sheet laminate 111 has a raised portion 111C and recessed portions 111D. The ceramic green sheet laminate 111 is sintered by firing the ceramic green sheet laminate 111 at a predetermined temperature, whereby a mother substrate is obtained.

After the first and second passive elements 14A and 14B are mounted in the recessed portions 111D of the mother substrate, a prepreg is hot-pressed against the recessed portion side of the mother substrate, whereby the first and second passive elements 14A and 14B are embedded in the recessed portions thereof. The prepreg is heat-cured, whereby the composite resin layer 15 is formed. Via-holes are formed in the composite resin layer 15 in a predetermined pattern and are then filled with a conductive resin, whereby the via-hole conductors 17 are formed. The external terminal electrodes 16 are formed on a surface of the composite resin layer 15 by a lithographic or etching technique, for example. The mother substrate is turned over and the integrated circuit element 13 is mounted on a flat surface of the mother substrate that does not include recessed portions. In this operation, the raised portion 11C and the integrated circuit element 13 are arranged so as to overlap with each other in plan view. The mother substrate is divided into pieces, whereby the component-containing module 10 according to this preferred embodiment is obtained.

In this preferred embodiment, the raised portion 11C and recessed portions 11D of the component-containing module 10 are simultaneously formed using the second ceramic green sheets 111'A having the stamped out portions 111'D as described above. A mother substrate for forming the core substrate 11 used in this preferred embodiment may be formed such that a tabular first ceramic laminate and block-shaped second ceramic laminates are prepared in advance, the second ceramic laminates are disposed on the first ceramic laminate, and the first and second ceramic laminates are bonded together.

According to this preferred embodiment, the component-containing module 10 has the lower surface 11B, which includes the raised portion 11C and recessed portions 11D, and the upper surface 11E, which faces the lower surface 11B, as described above. The component-containing module 10 includes the in-plane conductors 12A, which are arranged at the interface between the ceramic layers 11A and which have a predetermined pattern, the integrated circuit element 13, which is arranged at the location that is above the upper surface 11E and that corresponds to the raised portion 11C corresponding to the raised portion 11C, the first and second passive elements 14A and 14B, which are disposed in the recessed portions 11D of the lower surface 11B, the composite resin layer 15, which is disposed under the lower surface 11B and has the flat or substantially flat surface, and the external terminal electrodes 16, which are arranged on the flat surface of the composite resin layer 15 and are electrically connected to the surface electrodes 12C. The integrated circuit element 13 is disposed so as to overlap with the raised portion 11C in plan view. Therefore, even if the number of the terminal electrodes 13A under the integrated circuit element 13 is increased, the circuit patterns 12 can be arranged in the raised portion 11C without increasing the number of the ceramic layers 11A. The height of the first and second passive elements 14A and 14B, which are disposed in the recessed portions 11D, is less than that of the core substrate 11. This allows the component-containing module 10 to have low profile and a compact size. The number of the first and second passive elements 14A and 14B can be increased such that the recessed portions 11D are formed over a wide area by providing the raised portion 11C only at a necessary location. This advantage can be achieved when the first and second passive elements 14A and 14B are taller than the raised portion 11C.

According to this preferred embodiment, the core substrate 11 includes the ceramic layers 11A. Thus, even if the integrated circuit element 13 generates heat, the heat generated therefrom is readily transferred to the lower surface 11B through the ceramic layers 11A, which has good heat conductivity and is disposed in the raised portion 11C, and, therefore, can be efficiently dissipated from the lower surface 11B. This enables the component-containing module 10 to have increased cooling efficiency. Since the first and second passive elements 14A and 14B are separately arranged on both sides of the raised portion 11C, the first and second passive elements 14A and 14B separated from one another and, therefore, the electromagnetic interference therebetween can be significantly reduced. This enables the component-containing module 10 to have increased reliability.

Second Preferred Embodiment

FIG. 5 shows a component-containing module 10A of this preferred embodiment. The component-containing module 10A has a configuration substantially the same as that of the component-containing module 10 of the first preferred embodiment, except that the lower surface 11B of a core substrate 11 includes a second raised portion $11C_1$, a plurality of small via-hole conductors 17A are arranged in portions of a composite resin layer 15 that cover a corresponding one of the lower surface 11B of the raised portion 11C and the lower surface 11B of the second raised portion $11C_1$, and a third passive element 14C and a fourth passive element 14D are arranged on the upper surface 11E of the core substrate 11 so as to be adjacent to an integrated circuit element 13. In this preferred embodiment, the same components as those described in the first preferred embodiment or components corresponding to those described in the first preferred embodiment are denoted by the same reference numerals as those used in the first preferred embodiment. The principal features of this preferred embodiment are described below. In this preferred embodiment, a raised portion 11C located at the approximate center of the core substrate 11 is referred to as a first raised portion 11C.

In this preferred embodiment, the lower surface 11B of the core substrate 11 includes the first and second raised portions 11C and $11C_1$ and two recessed portions 11D and 11D as shown in FIG. 5, the first and second raised portions 11C and $11C_1$ and the recessed portions 11D being alternately arranged. The first and second raised portions 11C and $11C_1$ preferably have substantially the same height. The two recessed portions 11D and 11D preferably have substantially the same depth. A first passive element 14A and second passive element 14B are each disposed in a corresponding one of the two recessed portions 11D. The lower surface 11B of the core substrate 11 is entirely covered with the composite resin layer 15. The first and second passive elements 14A and 14B, which are disposed in the two recessed portions 11D and 11D, are covered and sealed with the composite resin layer 15. The lower surface of the composite resin layer 15 is flat or substantially flat. The raised portion 11C is arranged at a location at which a large number of in-plane conductors 12A are required because of the increase of the number of terminals under the integrated circuit element 13 as shown in FIG. 5. The second raised portion $11C_1$ is arranged at, for example, a location at which the heat generated from the third passive element 14C, such as a resistor, must be dissipated.

The small via-hole conductors 17A are arranged in the portions of the composite resin layer 15 that cover the first and second raised portions 11C and $11C_1$. The via-hole conductors 17 form a predetermined pattern. The small via-hole conductors 17A electrically connect surface electrodes 12C disposed under the lower surfaces 11B of the first and second raised portions 11C and $11C_1$ to external terminal electrodes 16 disposed under the lower surface of the composite resin layer 15. The small via-hole conductors 17A are defined by via-holes formed using a laser beam that are filled with a conductive paste. The via-holes, which are formed using the laser beam, have openings in the composite resin layer 15 and preferably have a tapered shape such that the via-holes are gradually reduced in diameter from the openings toward the lower surfaces 11B of the first and second raised portions 11C and $11C_1$. There is preferably substantially no difference in diameter between the openings of the small via-holes and portions of the small via-holes that are disposed under the lower surfaces of the first and second raised portions 11C and $11C_1$ because the small via-holes are formed in thin portions of the composite resin layer 15. Therefore, portions of the small via-hole conductors 17A that are disposed under the lower surfaces of the first and second raised portions 11C and $11C_1$ have an area substantially equal to that of portions of the small via-hole conductors 17A that are disposed in the lower surface of the composite resin layer 15.

The small via-hole conductors 17A are preferably used as interconnections for signal transmission or thermal conductors for heat dissipation in some cases. In the case of using the small via-hole conductors 17A only for heat dissipation, the small via-hole conductors 17A may preferably be directly connected to ceramic layers 11A included in the second raised portion $11C_1$.

In the case of using the small via-hole conductors 17A as interconnections for signal transmission, the outer diameter of the small via-hole conductors 17A may be reduced in accordance with a reduction in size of the surface electrodes 12C under the lower surfaces 11B of the first and second raised portions 11C and 11C₁ and external terminal electrodes 16A under the lower surface of the composite resin layer 15. This enables the high density interconnection of the component-containing module 10A and enables the component-containing module 10A to have a smaller size.

In the case of using the small via-hole conductors 17A as thermal conductors for heat dissipation, heat can be efficiently dissipated from heat-dissipating electrodes outside such that a large number of the small via-hole inductors 17A are provided in the composite resin layer 15 and the heat dissipation areas of the first and second raised portions 11C and 11C₁ are maintained to the lower surface of the composite resin layer 15 and properties of the component-containing module 10A can be prevented from being deteriorated such that heat is inhibited or prevented from being transferred to the first and second passive elements 14A and 14B in the composite resin layer 15. In particular, when the portions of the composite resin layer 15 that cover the first and second raised portions 11C and 11C₁ have a relatively small thickness, the areas of the small via-hole conductors 17A under the lower surfaces 11B thereof can be maintained to the lower surface of the composite resin layer 15, whereby increased heat dissipation efficiency can be achieved.

According to this preferred embodiment, the small via-hole conductors 17A are arranged in the portions of the composite resin layer 15 that cover the first and second raised portions 11C and 11C₁. Therefore, even if the circuit patterns 12 are densely arranged in the first and second raised portions 11C and 11C₁ in response to the number of the terminals under the integrated circuit element 13 disposed above the raised portion 11C, the external terminal electrodes 16A under the lower surface of the composite resin layer 15 can be densely arranged such that the small via-hole conductors 17A are reduced in outer diameter. Furthermore, heat dissipation efficiency can be increased such that the number of the small via-hole conductors 17A is increased in accordance with a heat source (third passive element 14C) disposed above the second raised portion 11C₁ and heat transfer paths are provided such that the heat dissipation area of the second raised portion 11C₁ is maintained to the lower surface of the composite resin layer 15. In this preferred embodiment, the first and second raised portions 11C and 11C₁ and the first and second recessed portions 11D and 11D have substantially the same height and depths. Even if these portions have different heights or depths, substantially the same advantages as those described above can be achieved.

Third Preferred Embodiment

FIG. 6 shows a component-containing module 10B of this preferred embodiment. The component-containing module 10B has a configuration substantially the same as that of the component-containing module 10A of the second preferred embodiment, except that a high heat conductor 17B is arranged so as to cover the lower surface 11B of a raised portion 11C. In this preferred embodiment, the same components as those described in the second preferred embodiment or components corresponding to those described in the second preferred embodiment are denoted by the same reference numerals as those used in the second preferred embodiment. Principal features of this preferred embodiment are described below.

In this preferred embodiment, as shown in FIG. 6, the raised portion 11C is included in a core substrate 11, a portion of a composite resin layer 15 that covers the lower surface 11B of the raised portion 11C is entirely removed, and the high heat conductor 17B extends over the lower surface 11B of the raised portion 11C. The high heat conductor 17B is preferably made of a material (such as copper or a copper alloy) having high heat conductivity. The composite resin layer 15 and the high heat conductor 17B are preferably flush or substantially flush with each other and define a flat surface. According to this preferred embodiment, the high heat conductor 17B is disposed under the lower surface 11B of the high heat conductor 17B and, therefore, the heat dissipation efficiency of the raised portion 11C is increased. Even if the integrated circuit element 13 generates a large amount of heat, the heat generated therefrom is efficiently dissipated from the raised portion 11C and the high heat conductor 17B outside. Thus, the temperature of the integrated circuit element 13 can be prevented from being increased and the temperature of a first passive element 14A and that of a second passive element 14B can also be prevented from being increased. This is effective to prevent properties of the component-containing module 10 from being deteriorated. According to this preferred embodiment, substantially the same advantages as those described in the second preferred embodiment can be achieved.

Fourth Preferred Embodiment

FIG. 7 shows a component-containing module 10C of this preferred embodiment. The component-containing module 10B has a configuration substantially the same as that of the component-containing module 10A of the second preferred embodiment, except that a integrated circuit element 13, a third passive element 14C, and a fourth passive element 14D are embedded in a composite resin layer 15A and the composite resin layer 15A preferably has a flat or substantially flat upper surface covered with a shielding electrode 18 disposed thereon. In this preferred embodiment, the same components as those described in the second preferred embodiment or components corresponding to those described in the second preferred embodiment are denoted by the same reference numerals as those used in the second preferred embodiment. Principal features of this preferred embodiment are described below.

In this preferred embodiment, as shown in FIG. 7, the shielding electrode 18 is electrically connected to a surface electrode (ground electrode) 12C by a via-hole conductor 17C extending through the composite resin layer 15A, the surface electrode 12C being disposed on the upper surface 11E of a core substrate 11. The via-hole conductor 17C can be formed in the same or substantially the same manner as that described in the first preferred embodiment. In this preferred embodiment, small via-hole conductors 17A are disposed in a portion of a composite resin layer 15 that covers the lower surface 11B of a raised portion 11C and a fifth passive element 14E that is preferably a low-profile component is disposed in a sub-portion of the lower surface 11B-covering portion of the composite resin layer 15. The fifth passive element 14E preferably has a mounting height less than that of a first passive element 14A and a second passive element 14B. This is effective to increase the packaging density of electronic components. The shielding electrode 18 and the composite resin layer 15 can be formed such that after, for example, a prepreg having a surface covered with a sheet of copper is hot-pressed against the upper surface 11E of the core substrate 11 such that the copper sheet is directed upward, the prepreg is heat-cured, the integrated circuit element 13 and the third and fourth passive elements 14C and 14D being disposed on the upper surface 11E of the core substrate 11. Alternatively, the shielding electrode 18 can be formed such that after the prepreg is hot-pressed against the upper surface 11E of the core substrate 11 and is then heat-cured, the upper surface of the composite resin layer 15A is plated or is coated with a conductive paste, the integrated circuit element 13 and the third and fourth passive elements 14C and 14D being disposed on the upper surface 11E of the core substrate 11.

According to this preferred embodiment, the integrated circuit element 13 and the third and fourth passive elements 14C and 14D, which are disposed on the upper surface 11E of the core substrate 11, are sealed in the composite resin layer 15A, whereby the integrated circuit element 13 and the third and fourth passive elements 14C and 14D can be protected from external temperatures and/or humid environments, for example. Furthermore, the upper surface of the composite resin layer 15A is covered with the shielding electrode 18 and the shielding electrode 18 is electrically connected to the ground electrode 12C, which is disposed on the upper surface 11E of the core substrate 11, through the via-hole conductor 17C, whereby the integrated circuit element 13 and the third and fourth passive elements 14C and 14D can be protected from external electromagnetic waves. The fifth passive element 14E, which is a low-profile component, is disposed under the lower surface 11B of the raised portion 11C. This effectively increases the packaging density of electronic components. The composite resin layers 15 and 15A are arranged on both surfaces of the core substrate 11. This effectively increases the mechanical strength of the component-containing module 10C. According to this preferred embodiment, substantially the same advantages as those described in the second preferred embodiment can be achieved in addition to the above-described advantages.

The present invention is not limited to the preferred embodiments described. Elements of the present invention may be modified as required. The core substrate described in each preferred embodiment is made of ceramic. However, the core substrate may be made of resin. This is advantageous in that the core substrate is unlikely to be warped or cracked due to a change in temperature.

Preferred embodiments of the present invention provide a component-containing module suitable for use in various electronic devices, such as mobile communication devices.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A component-containing module comprising:
a core substrate including a first principal surface and a second principal surface facing the first principal surface, said first principal surface including recessed portions and a raised portion, said core substrate including a plurality of interconnection layers;
an integrated circuit element arranged at a location which is above the second principal surface and which corresponds to the raised portion;
passive elements disposed in the recessed portions of the first principal surface;
a resin layer overlying at least one of the first and second principal surfaces and which includes a substantially flat surface; and
an electrode disposed on the substantially flat surface of the resin layer and being electrically connected to the interconnection layers.

2. The component-containing module according to claim 1, wherein the core substrate is made of ceramic.

3. The component-containing module according to claim 1, wherein the resin layer overlies the first principal surface and covers the raised portion.

4. The component-containing module according to claim 1, further comprising a via-hole conductor connecting a convex surface of the raised portion to the electrode disposed on the substantially flat surface of the resin layer.

5. The component-containing module according to claim 3, further comprising a high heat conductor disposed in a portion of the resin layer that covers the convex surface of the raised portion.

6. The component-containing module according to claim 1, wherein the raised portion is disposed at substantially a center of the first principal surface of the core substrate, the recessed portions are arranged on both sides of the raised portion, and the passive elements are separately disposed in the recessed portions.

7. The component-containing module according to claim 1, wherein the resin layer is provided on both of the first and second principal surfaces.

8. The component-containing module according to claim 7, further comprising a shielding layer disposed on the resin layer provided on one of the first and second principal surfaces that is different from the resin layer provided on the at least one of the first and second principal surfaces on which the electrode is disposed.

* * * * *